US007797653B2

(12) United States Patent
Hosokawa

(10) Patent No.: US 7,797,653 B2
(45) Date of Patent: Sep. 14, 2010

(54) CIRCUIT VERIFICATION APPARATUS, CIRCUIT VERIFICATION METHOD, AND SIGNAL DISTRIBUTION METHOD FOR THE SAME

(75) Inventor: Kouhei Hosokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 652 days.

(21) Appl. No.: 11/547,146

(22) PCT Filed: Mar. 29, 2005

(86) PCT No.: PCT/JP2005/006567

§ 371 (c)(1),
(2), (4) Date: Apr. 23, 2007

(87) PCT Pub. No.: WO2005/096500

PCT Pub. Date: Oct. 13, 2005

(65) Prior Publication Data
US 2007/0214443 A1 Sep. 13, 2007

(30) Foreign Application Priority Data
Mar. 30, 2004 (JP) ............................. 2004-098530

(51) Int. Cl.
G06F 17/50 (2006.01)
(52) U.S. Cl. ............................................. 716/5; 716/4
(58) Field of Classification Search ...................... 716/1, 716/4–7, 18; 703/14–17
See application file for complete search history.

(56) References Cited

U.S. PATENT DOCUMENTS

| 5,475,830 | A | | 12/1995 | Chen et al. | |
| 5,649,167 | A | | 7/1997 | Chen et al. | |
| 5,734,869 | A | * | 3/1998 | Chen ............................ | 703/15 |
| 5,758,123 | A | * | 5/1998 | Sano et al. .................... | 703/22 |
| 5,835,751 | A | | 11/1998 | Chen et al. | |

(Continued)

FOREIGN PATENT DOCUMENTS

| JP | 7-334384 | 12/1995 |
| JP | 11-134385 | 5/1999 |
| JP | 11-265299 | 9/1999 |
| JP | 2002-507294 | 3/2002 |

OTHER PUBLICATIONS

European Official Action dated Feb. 25, 2010.

Primary Examiner—Vuthe Siek
(74) Attorney, Agent, or Firm—Scully, Scott, Murphy & Presser, P.C.

(57) ABSTRACT

A circuit to be verified is divided into a plurality of circuit parts. A plurality of programmable devices are provided for implementing functional operation of the divided circuit parts through a simulation. Wiring used in the circuit to be verified for supplying a signal $S_X$ to be given at the same time to the plurality of programmable devices is provided so that a maximum skew of time at which the signal $S_X$ arrives at the plurality of programmable devices is less than a minimum time required for data transfer between the programmable devices. An input terminal PX for inputting the signal $S_X$ from a signal generation device (400) is implemented in each of the programmable devices. The signal $S_X$ can be inputted directly from the signal generation device, and a skew can be inhibited from being produced.

5 Claims, 12 Drawing Sheets

U.S. PATENT DOCUMENTS

| | | | |
|---|---|---|---|
| 5,841,967 A * | 11/1998 | Sample et al. | 714/33 |
| 5,911,061 A | 6/1999 | Tochio et al. | |
| 6,009,531 A | 12/1999 | Selvidge et al. | |
| 6,301,553 B1 | 10/2001 | Burgun et al. | |
| 7,512,917 B2 * | 3/2009 | Izumi et al. | 716/5 |
| 2004/0210857 A1 * | 10/2004 | Srinivasan | 716/2 |

* cited by examiner

CIRCUIT VERIFICATION APPARATUS, CIRCUIT VERIFICATION METHOD, AND SIGNAL DISTRIBUTION METHOD FOR THE SAME

TECHNICAL FIELD

The present invention relates to design support technology for logic circuits, and more particularly to a circuit verification apparatus and a circuit verification method for verifying operation of synchronous circuits with use of a plurality of programmable devices.

BACKGROUND ART

It has been customary to employ a hardware emulator using a programmable device such as FPGA or CPLD for verification of operation of a digital LSI. However, as a circuit scale becomes larger and larger year by year, it is getting difficult to allocate the entire digital LSI to one programmable device. Accordingly, some technology has been proposed to resolve such a problem.

For example, Japanese laid-open patent publication No. 11-134385 discloses a method of allocating a circuit to be tested to a plurality of programmable devices. In this method, when the circuit to be tested is to be divided, allocation is performed such that a net having a timing margin of a path delay which is not more than a predetermined value does not extend between programmable devices, from the viewpoint of the fact that a path delay extending between programmable devices becomes a critical path in many cases.

However, the circuit allocation method disclosed by Patent Document 1 does not take into consideration a signal that needs to transmit a change to circuits divided in a plurality of programmable devices at the same time. Accordingly, some circuits, particularly some synchronous circuits, cannot be verified correctly, This problem becomes significant when a clock signal of a digital LSI is distributed. Conventional problems will be described below with use of specific examples.

FIG. 1 is a block diagram showing an example in which a circuit 101 to be verified is divided into two parts, which are allocated to programmable devices 1 and 2, respectively. The circuit 101 to be verified is formed by three cascaded flip-flop circuits A, B, and C. Here, a highest circuit 102 having the flip-flop circuits (FF) A and C is allocated to the programmable device 1, and a circuit part having the flip-flop circuit B is allocated to the programmable device 2.

A clock signal CLK generated by a clock generator 103 is supplied through internal wiring of the programmable device 1 to clock inputs of the flip-flop circuits A and C and supplied from a clock output terminal of the programmable device 1 through wiring between the programmable devices to the programmable device 2. Data at a data output terminal D1 of the flip-flop circuit A is transferred through internal wiring of the programmable devices and wiring between the programmable devices to a data input terminal of the flip-flop circuit B in the programmable device 2. Further, data at a data output terminal D2 of the flip-flop circuit B is transferred through internal wiring of the programmable devices and wiring between the programmable devices to a data input terminal of the flip-flop circuit C in the programmable device 1.

In such an arrangement in which three cascaded flip-flops are implemented in the programmable devices 1 and 2, outputs of the respective flip-flops are shifted from their inputs by one clock cycle if delays of wiring and devices are ideal. Accordingly, data at a data output terminal of the third flip-flop circuit C should have a delay of three cycles as compared to a data input terminal D0 of the first flip-flop circuit A.

Practically, however, there are delays in all circuit elements and wiring. Specifically, there is a delay $D_Y$ from the data output terminal D1 of the flip-flop circuit A to the data input terminal of the flip-flop circuit B. There is a delay $D_X$ from a CLK input terminal of the programmable device 1 to a clock terminal of the flip-flop circuit B.

A problem arises when an input of a clock signal CLK to the flip-flop circuit B has a large delay as compared to timing of the data input ($D_X > D_Y$). As described above, when data x0 is latched by the flip-flop circuit A, and the data x0 appears on the output terminal D1. Then, the data x0 appears on the data input terminal of the flip-flop circuit B after a delay of $D_Y$. Since a clock signal CLK having a delay of $D_X$ is then inputted to the clock input terminal of the flip-flop circuit B, the flip-flop circuit B latches the data input x0 at that time. Under the influence of this behavior, a final data output of the flip-flop circuit C varies one cycle earlier than a normal output.

Such abnormal operation is caused by the fact that the clock input of the flip-flop circuit B is delayed from the data input of the flip-flop circuit B. Since the technology disclosed by Patent Document 1 as described above does not take into consideration a signal to be given at the same time, such as a clock signal, it cannot avoid occurrence of the aforementioned abnormal operation and cannot perform a circuit verification correctly.

It is, therefore, an object of the present invention to provide a circuit verification apparatus, a circuit verification method, and a signal distribution method for the same which can correctly verify a circuit to be tested.

DISCLOSURE OF INVENTION

According to a first aspect of the present invention, there is provided a circuit verification apparatus for verifying functional operation of a circuit to be verified through a simulation. For verification, the circuit to be verified is divided into a plurality of circuit parts. The circuit verification apparatus includes a plurality of simulation parts (programmable devices) for implementing the divided circuit parts, a first wiring part for connecting the plurality of simulation parts so as to allow intercommunication therebetween, a first signal generation part for generating a first signal to be given at the same timing to two or more simulation parts of the plurality of simulation parts, and a second wiring part for supplying the first signal from the first signal generation part directly to the two or more simulation parts. In the circuit verification apparatus, each of the two or more simulation parts implements an input terminal connected to the second wiring part for inputting the first signal from the first signal generation part. The second wiring part is configured so that a maximum skew of time at which the first signal outputted from the first signal generation part arrives at the two or more simulation parts is less than a minimum time required for data transfer through the first wiring part between the plurality of simulation parts.

In the circuit verification apparatus according to the first aspect, the first signal is a signal to be given at the same timing to the circuit parts implemented in the two or more simulation parts, and the first signal is supplied through the input terminal to the circuit part in each of the two or more simulation parts.

The circuit verification apparatus according to the first aspect may further include a second signal generation part for generating a second signal to be given at the same timing to the circuit parts implemented in the two or more simulation parts. Each of the two or more simulation parts may include a synchronization part for synchronizing the second signal with the first signal and supplying the synchronized signal to the circuit part. In this case, the second signal generation part supplies the second signal through wiring to each of the two or more simulation parts. Further, the second signal generation part may be incorporated in one of the two or more simulation parts. The second signal is transferred through the first wiring part to another simulation part. Alternatively, the second signal generation part may be incorporated in each of the two or more simulation parts.

According to a second aspect of the present invention, there is provided a signal distribution method in a circuit verification apparatus in which a circuit to be verified is divided into a plurality of circuit parts. The circuit verification apparatus has a plurality of simulation parts for implementing functional operation of each of divided circuit parts through a simulation. In the signal distribution method, a first signal to be given at the same timing to two or more simulation parts of the plurality of simulation parts is generated, an input terminal for inputting the first signal is formed in each of the two or more simulation parts, and the first signal is distributed to the input terminals of the two or more simulation parts so that a maximum skew of time at which the first signal arrives at the input terminals of the two or more simulation parts is less than a minimum time required for data transfer between the plurality of simulation parts.

According to a third aspect of the present invention, there is provided a circuit verification system for implementing a circuit verification apparatus for verifying functional operation of a circuit to be verified through a simulation. The circuit verification system includes a plurality of simulation parts, a first wiring part for connecting the plurality of simulation parts so as to allow intercommunication therebetween, a division process part for dividing the circuit to be verified into a plurality of circuit parts so that each of the plurality of simulation parts implements the circuit part to generate implementation data, a programming part for implementing the implementation data in each of the plurality of simulation parts, a first signal generation part for generating a first signal to be given at the same timing to two or more simulation parts in the plurality of simulation parts, and a second wiring part for supplying the first signal from the first signal generation part directly to the two or more simulation parts. The division process part implements an input terminal connected to the second wiring part for inputting the first signal from the first signal generation part in each of the two or more simulation parts. The second wiring part is configured so that a maximum skew of time at which the first signal outputted from the first signal generation part arrives at the two or more simulation parts is less than a minimum time required for data transfer through the first wiring part between the plurality of simulation parts.

According to a fourth aspect of the present invention, there is provided a circuit verification method of verifying functional operation of a circuit to be verified through a simulation. For verification, the circuit to be verified is divided into a plurality of circuit parts. In the circuit verification method, each of the divided circuit parts is implemented in a plurality of simulation parts, the plurality of simulation parts are connected by a first wiring part so as to allow intercommunication therebetween, a first signal to be given at the same timing to two or more simulation parts of the plurality of simulation parts is generated, and the first signal is supplied directly to the two or more simulation parts through a second wiring part. An input terminal connected to the second wiring part for inputting the first signal is implemented in each of the two or more simulation parts. The second wiring part is configured so that a maximum skew of time at which the first signal arrives at the two or more simulation parts is less than a minimum time required for data transfer through the first wiring part between the plurality of simulation parts.

BEST MODE FOR CARRYING OUT THE INVENTION

First Embodiment (System Configuration)

Figure 1:
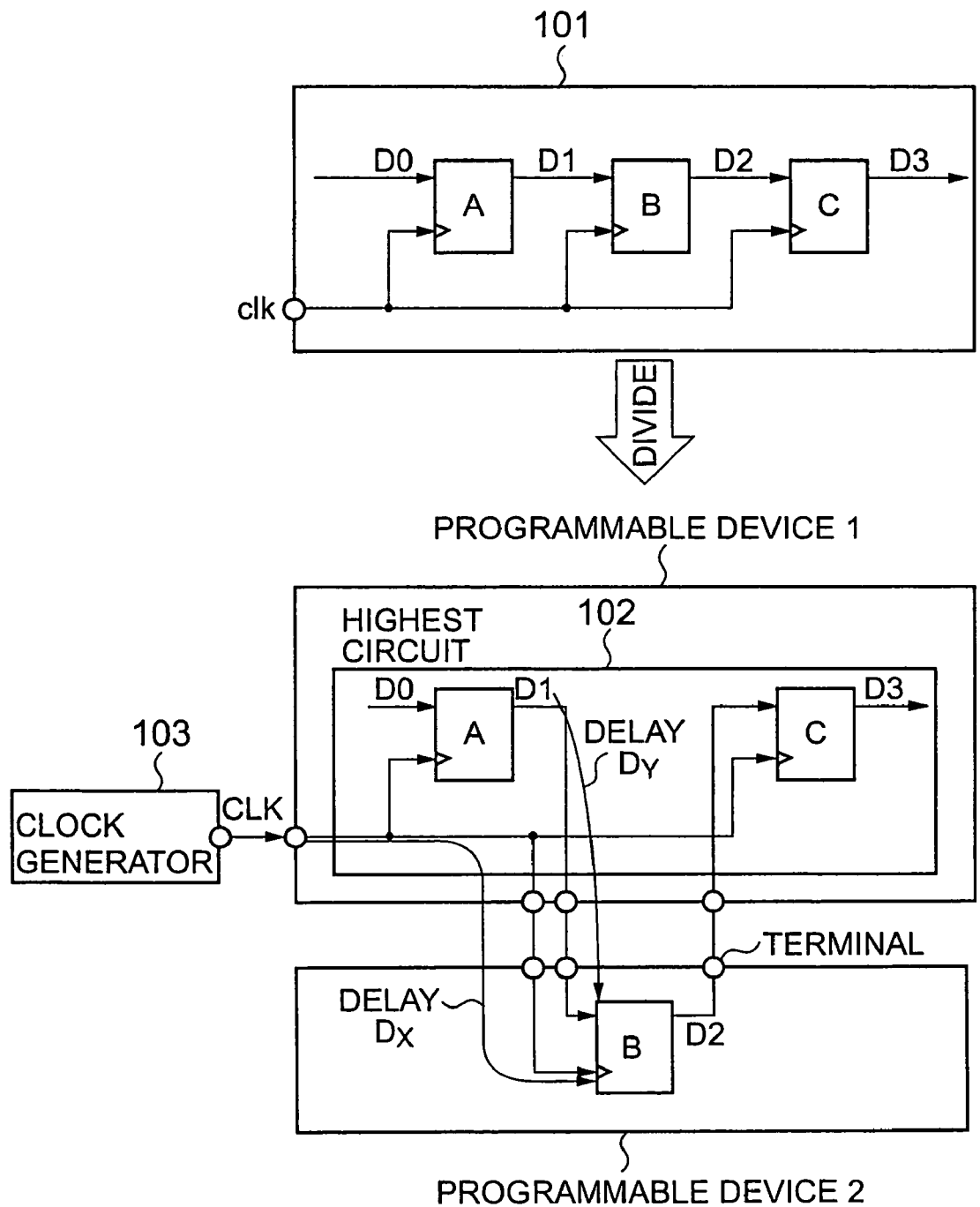
FIG. 1 is a block diagram explanatory of a conventional example in which three cascaded flip-flop circuits are allocated to two programmable devices and of problems caused in the conventional example.
Figure 2:
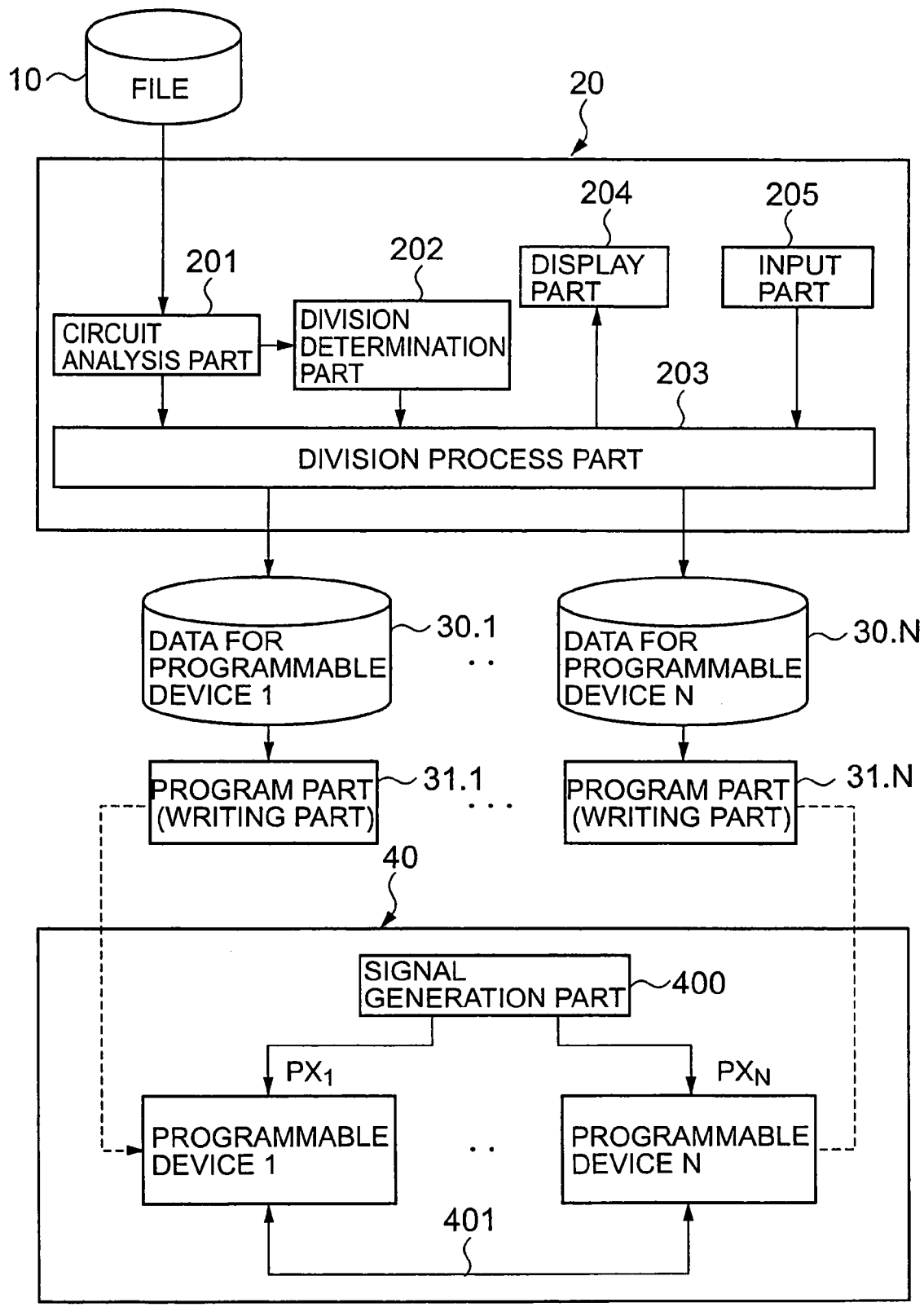
FIG. 2 is a schematic block diagram of a circuit verification system according to a first embodiment of the present invention.

FIG. 2 is a schematic block diagram of a circuit verification system according to a first embodiment of the present invention. There will be described a case in which a circuit to be verified is divided and allocated to N programmable devices.

The circuit verification system includes a circuit division apparatus 20 for performing a circuit division process based on an inputted file 10, in which contents of a circuit to be verified are described. The circuit verification system also has program parts (programming parts) 31.1-31.N operable to write data 30.1-30.N for programmable devices, which are produced by the circuit division apparatus 20, into programmable devices 1-N, respectively, and a circuit verification apparatus 40 including programmable devices (simulation parts) 1-N.

The circuit division apparatus 20 comprises a computer system including a circuit analysis part 201, a division determination part 202, a division process part 203, a display part 204, and an input part 205. The circuit analysis part 201 is operable to analyze the file 10 to acquire circuit information. The division determination part 202 is operable to determine how to divide the circuit to be verified into N partial circuits with use of the acquired circuit information. The display part 204 is implemented by an LCD or the like, and the input part 205 is implemented by a keyboard, a pointing device, or the like.

The division process part 203 is operable to acquire all signal names from the circuit information acquired by the circuit analysis part 201, display the signal names on the display part 204, and urge a user to specify a signal to be given at the same time. When a signal name to be given at the same time is specified by the user, the division process part 203 performs a circuit division according to the circuit information from the circuit analysis part 201 and the circuit division method from the division determination part 202, At that time, if the signal to be given at the same time are used for a divided circuit, wiring for reducing skews is incorporated therein as described later, Thus, data 30.1-30.N for programmable devices which are to be implemented in the programmable devices 1-N are produced and written into the respective programmable devices 1-N by the program parts 30.1-30.N.

The circuit verification apparatus 40 includes N programmable devices 1-N, wiring (first wiring part) 401 for transferring a signal between these programmable devices, and a signal generation part (first signal generation part) 400 operable to generate at least one signal to be given at the same time. When data for the corresponding programmable devices are written into the programmable devices 1-N, pins $PX_1$-$PX_N$ to which a signal (first signal) to be given at the same time are inputted from the signal generation part 400 are set in the programmable devices 1-N. The circuit verification apparatus 40 according to the first embodiment will be described below in greater detail.

(Circuit Verification Apparatus)

Figure 3:
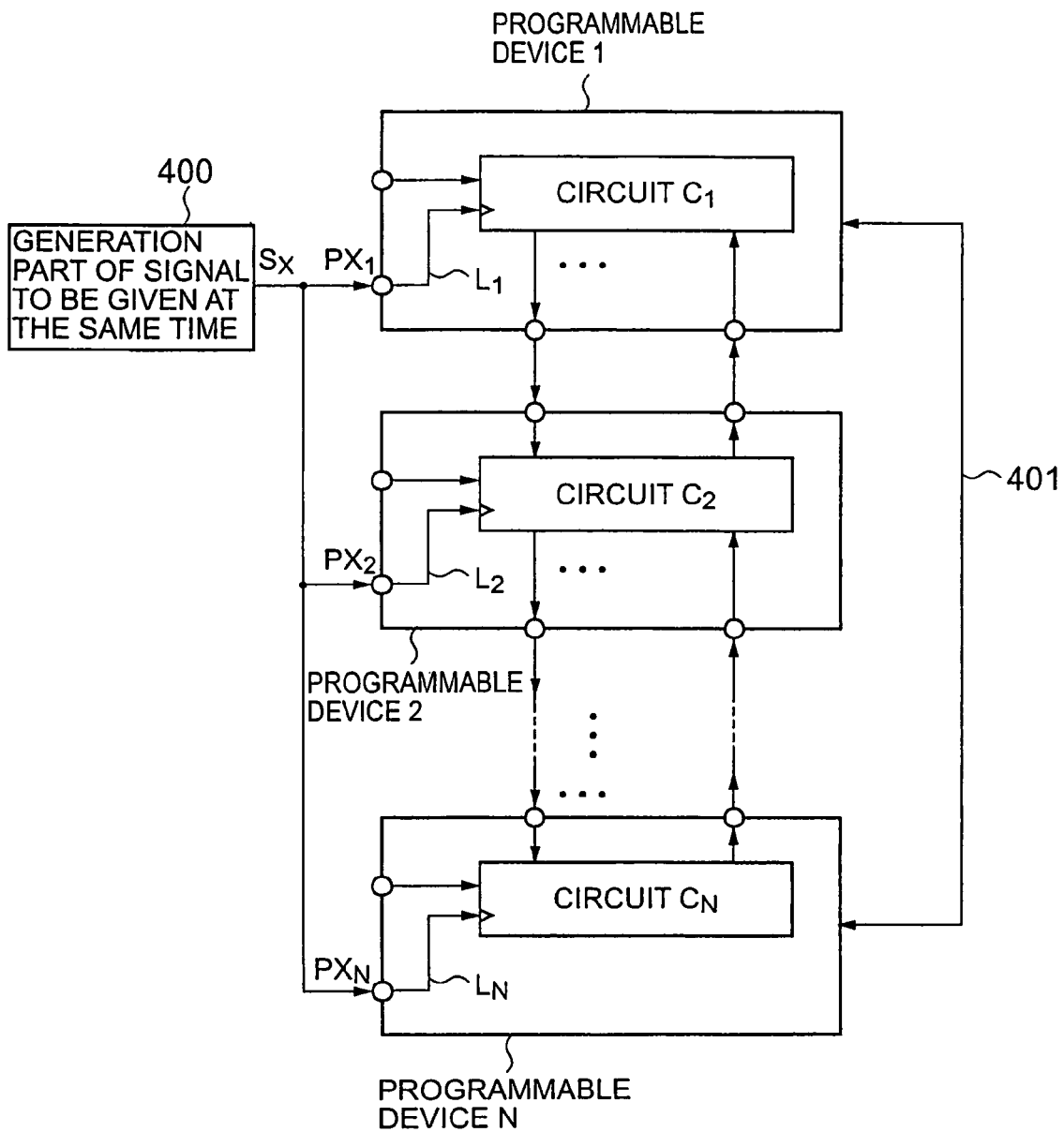
FIG. 3 is a schematic block diagram of a circuit verification apparatus according to the first embodiment of the present invention.

FIG. 3 is a schematic block diagram of the circuit verification apparatus according to the first embodiment. Circuits $C_1$, $C_2$, ..., $C_N$ are allocated when data for the corresponding programmable devices are written into the programmable devices (simulation parts) 1, 2, ..., N. Further, wiring (second wiring parts) $L_1$, $L_2$, ..., $L_N$ and pins $PX_1$, $PX_2$, ..., $PX_N$ for inputting a signal $S_X$ (first signal) to be given at the same time into the respective circuits $C_1$, $C_2$, ..., $C_N$ from the signal generation part 400 are formed.

An output terminal of the signal generation part 400 and the pins $PX_1$-$PX_N$ of the programmable devices 1-N should be interconnected by wiring having a small skew. More specifically, when a signal $S_X$ is transferred from the signal generation part 400 to the circuits $C_1$-$C_N$ in the programmable devices 1-N, arrival times $D_{Xi}$ (i=1, 2, ..., N) are different from each other because of differences of wiring path lengths. A maximum value of the arrival time difference (maximum skew) should be less than a minimum time $D_{MIN}$ required for data transfer through the wiring (first wiring part) 401 between the programmable devices. With regard to delays caused in the programmable devices 1-N, variations can be reduced using speed constraint provided by an arrangement and wiring program for programmable devices.

When the respective programmable devices are thus programmed, the signal $S_X$ to be given at the same time can be given directly to the respective pins $PX_1$-$PX_N$ of the programmable devices 1-N. Accordingly, it is possible to inhibit skews which would be caused if a signal were transmitted from a highest circuit to a lower circuit in the prior art.

Second Embodiment

In the aforementioned first embodiment, a signal $S_X$ (first signal) to be given at the same time is given to the circuits $C_1$-$C_N$, respectively. However, in a second embodiment, another signal $S_Y$ (second signal) to be given at the same time is synchronized with use of the signal $S_X$ in the respective programmable devices. Specifically, even if a signal $S_Y$ is transmitted through wiring having a large skew, a signal can be supplied to the respective circuits substantially at the same time by synchronization with the signal $S_X$. The second embodiment will be described below in detail.

(System Configuration)

Figure 4:
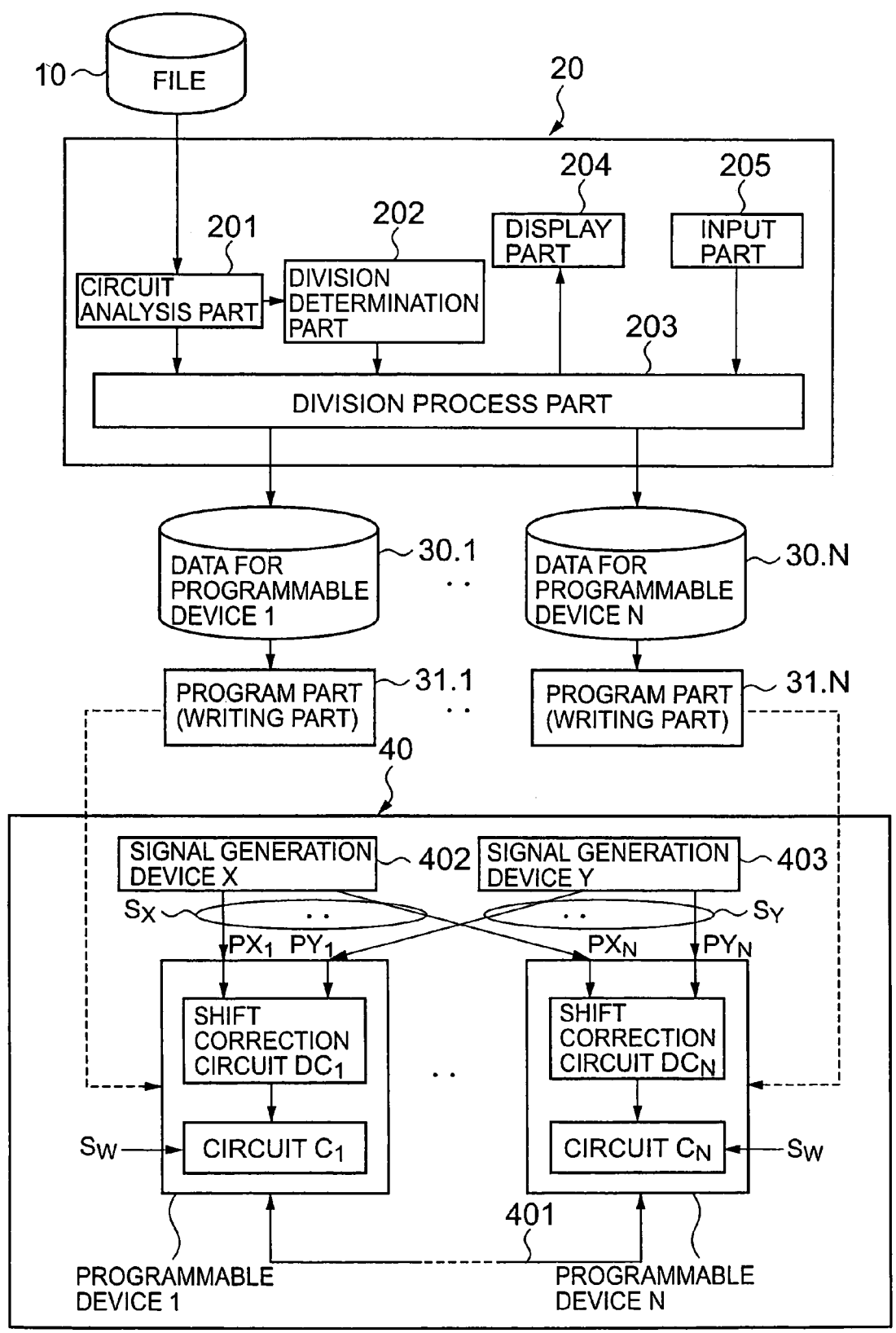
FIG. 4 is a schematic block diagram of a circuit verification system according to a second embodiment of the present invention.

FIG. 4 is a schematic block diagram of a circuit verification system according to a second embodiment of the present invention. There will be described a case in which a circuit to be verified is divided and allocated to N programmable devices.

The circuit verification system includes a circuit division apparatus 20 for performing a circuit division process based on an inputted file 10, in which contents of a circuit to be verified are described, program parts 31.1-31.N operable to write data 30.1-30.N for programmable devices, which are produced by the circuit division apparatus 20, into programmable devices 1-N, respectively, and a circuit verification apparatus 40 including programmable devices 1-N.

The circuit division apparatus 20 comprises a computer system including a circuit analysis part 201, a division determination part 202, a division process part 203, a display part 204, and an input part 205. The circuit analysis part 201 is operable to analyze the file 10 to acquire circuit information. The division determination part 202 is operable to determine how to divide the circuit to be verified into N partial circuits with use of the acquired circuit information. The display part 204 is implemented by an LCD or the like, and the input part 205 is implemented by a keyboard, a pointing device, or the like.

The division process part 203 is operable to acquire all signal names from the circuit information acquired by the circuit analysis part 201, display the signal names on the display part 204, and urge a user to specify a signal to be given at the same time. When a signal name to be given at the same time is specified by the user, the division process part 203 performs a circuit division according to the circuit information from the circuit analysis part 201 and the circuit division method from the division determination part 202. At that time, if the signal to be given at the same time is used for a divided circuit, a shift correction circuit (or synchronization circuit) is incorporated therein as described later. Thus, data 30.1-30.N for programmable devices which are to be implemented in the programmable devices 1-N are produced and written into the respective programmable devices 1-N by the program parts 31.1-31.N.

The circuit verification apparatus 40 includes N programmable devices 1-N and wiring 401 for transferring a signal between these programmable devices. Further, the circuit verification apparatus 40 includes a signal generation device (first signal generation part) X402 operable to generate a signal (first signal) $S_X$, a signal generation device (second signal generation part) Y403 operable to generate at least one signal (second signal) $S_Y$ to be given at the same time, and a signal generation device W (not shown) operable to generate a signal $S_W$. The signal $S_W$ is a signal to be inputted to a highest circuit through wiring that needs no skew adjustment. When data for the corresponding programmable devices are written into the programmable devices 1-N, pins $PX_1$-$PX_N$, pins $PY_1$-$PY_M$, circuits $C_1$-$C_N$, and shift correction circuits (synchronization parts) $DC_1$-$DC_N$ are implemented.

Figure 5A:
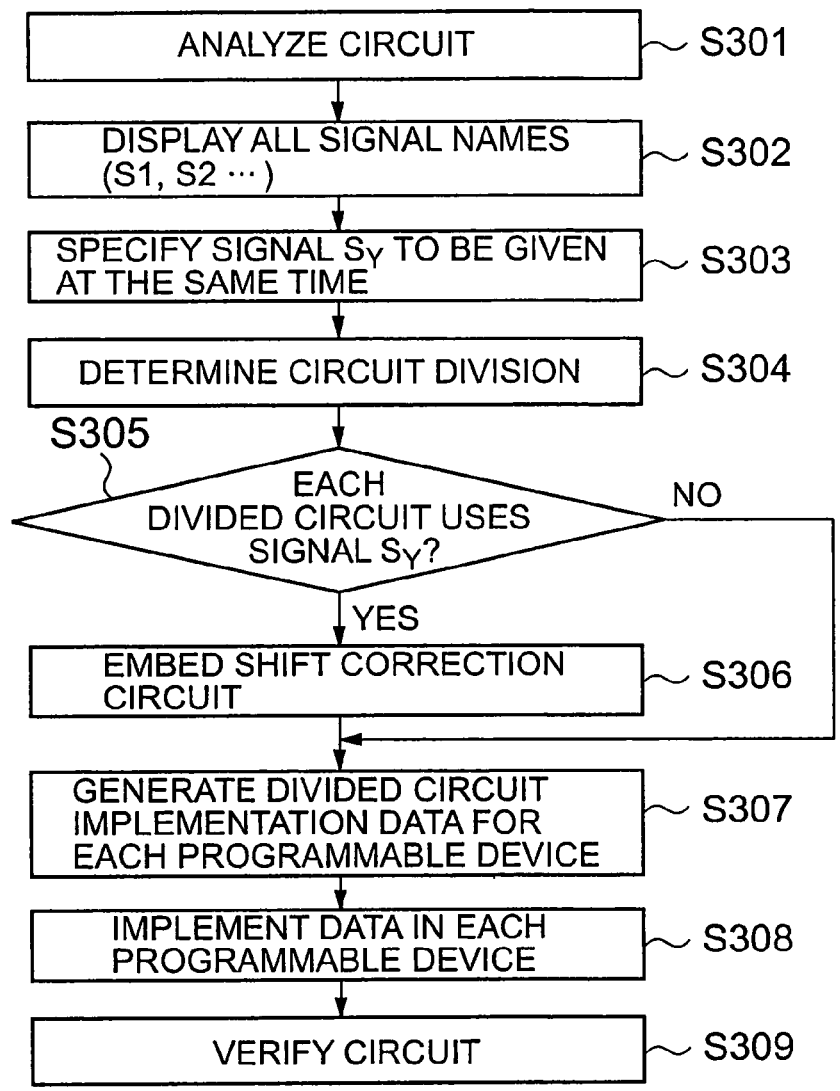
FIGS. 5A and 5B are flow charts showing control operation and circuit verification operation of the circuit verification system according to the second embodiment of the present invention, respectively.
Figure 5B:
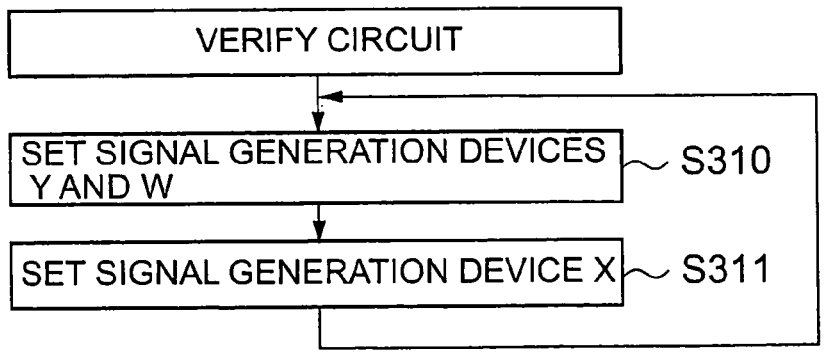

FIG. 5A and FIG. 5B are flow charts showing control operation of the circuit verification system according to the second embodiment. First, in FIG. 5A, the circuit analysis part 201 analyzes a file 10 to acquire circuit information (Step S301). Then, the division process part 203 acquires all signal names from the circuit information, displays the signal names on the display part 204, and urges a user to specify a signal to be given at the same time (Step S302).

When the user specifies a signal $S_Y$ to be given at the same time with use of the input part 205 (Step S303), the division process part 203 determines how to divide the circuit to be verified into N partial circuits (Step S304). At that time, the division process part 203 judges whether the specified signal $S_Y$ is used in the divided circuit parts (Step S305). If a circuit is judged to use the signal $S_Y$ in Step S305 (YES of Step S305), then the apparatus is programmed so as to incorporate pins $PX_1$-$PX_N$ into which a signal $S_X$ to be given at the same time is inputted, pins $PY_1$-$PY_N$ into which a signal $S_Y$ to be given at the same time is inputted, and shift correction circuits $DC_1$-$DC_N$ into the circuit (Step S306). If a circuit is judged not to use the signal $S_Y$ (NO of Step S305), no shift correction circuits are incorporated, or the apparatus is programmed so as to connect input terminals of shift correction circuits directly to output terminals of the shift correction circuits.

The division process part 203 generates data 30.1-30.N for the programmable devices, which are to be implemented in the programmable devices 1-N (Step S307), and the data are implemented in the programmable devices 1-N by the corresponding program parts (Step S308). Thus, verification operation is executed for the circuit to be verified, which is divided into the programmable devices 1-N (Step S309).

For the verification operation of the circuit to be verified, as shown in FIG. 5B, the signal generation devices Y (403) and W (not shown) are activated so as to supply signals $S_Y$ and $S_W$ to the respective programmable devices (Step S310). Subsequently, in order to supply the signal $S_Y$ to the respective circuits at predetermined time T, the signal generation device X (402) is activated so as to supply a signal $S_X$ to the respective programmable devices (Step S311). Thus, the signal $S_Y$ to be given at the same time is supplied to the respective circuits in synchronism with the signal $S_X$ having a small skew.

The circuit verification apparatus according to the present embodiment will be described below in detail.

(Circuit Verification Apparatus)

Figure 6:
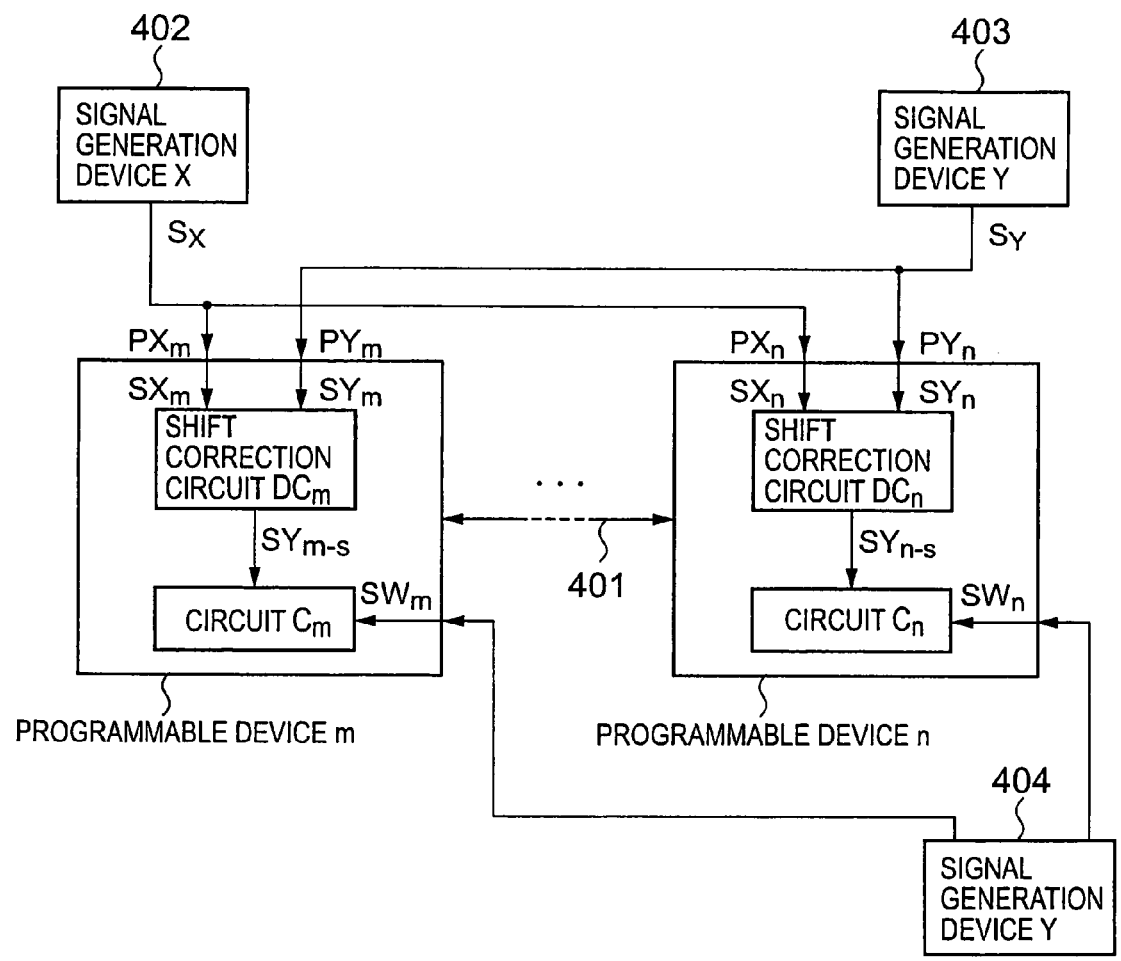
FIG. 6 is a schematic block diagram explanatory of operation of a circuit verification apparatus according to the second embodiment of the present invention.

FIG. 6 is a schematic block diagram explanatory of operation of the circuit verification apparatus according to the second embodiment of the present invention. Here, only two programmable devices m and n are illustrated for brevity. The circuit verification apparatus includes wiring 401 for transferring a signal between a plurality of programmable devices, a signal generation device X402 operable to generate a signal $S_X$ to be given at the same time, a signal generation device Y403 operable to generate at least one signal $S_Y$ to be given at the same time, and a signal generation device W404 operable to generate a signal $S_W$.

The signal $S_X$ outputted from the signal generation device X402 arrives at pins $PX_m$ and $PX_n$ of the programmable devices m and n as signals $S_{Xm}$ and $S_{Xn}$ with delays $D_{Xi}$ (i=1, 2, ..., N). As described above, a maximum value of the arrival time difference of the signal $S_X$, which is caused between the programmable devices 1-N, should be less than a minimum time required for data transfer between the programmable devices. Similarly, the signal $S_Y$ outputted from the signal generation device Y403 arrives at pins $PY_m$ and $PY_n$ of the programmable devices m and n as signals $S_{Ym}$ and $S_{Yn}$ with delays $D_{Yi}$ (i=1, 2, ..., N).

When data for the corresponding programmable devices are written into the programmable devices m and n, circuits $C_m$ and $C_n$ and shift correction circuits (synchronization parts) $DC_m$ and $DC_n$ are implemented. The signals $S_{Xm}$ and $S_{Ym}$ are inputted into the shift correction circuit $DC_m$ through the pins $PX_m$ and $PY_m$, respectively. The signal $S_{Ym}$ is synchronized with the signal $S_{Xm}$. The shift correction circuit $DC_m$ supplies a synchronization signal $S_{Ym-S}$ to the circuit $C_m$. Similarly, the signal $S_{Xn}$ and $S_{Yn}$ are inputted into the shift correction circuit $DC_n$ through the pins $PX_n$ and $PY_n$, respectively. The signal $S_{Yn}$ is synchronized with the signal $S_{Xn}$. The shift correction circuit $DC_n$ supplies a synchronization signal $S_{Yn-S}$ to the circuit $C_n$.

Figure 13:
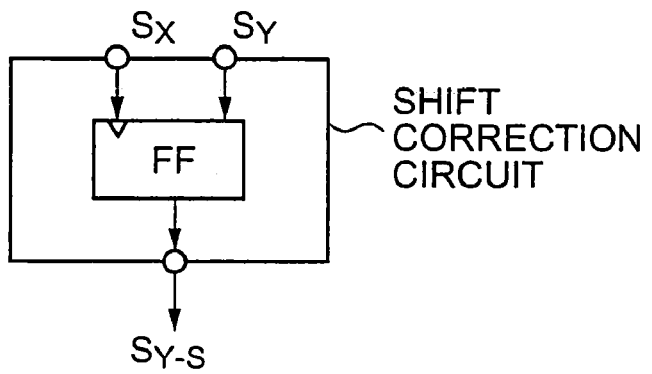
FIG. 13 is a circuit diagram showing an example of a shift correction circuit implemented in each programmable device shown in FIG. 12.

The shift correction circuit $DC_1$ can be formed by a flip-flop circuit having a clock input of a signal $S_{Xi}$, a data input of a signal $S_{Yi}$, and a data output of a synchronization signal $S_{Yi-S}$ (see FIG. 13).

Figure 7:
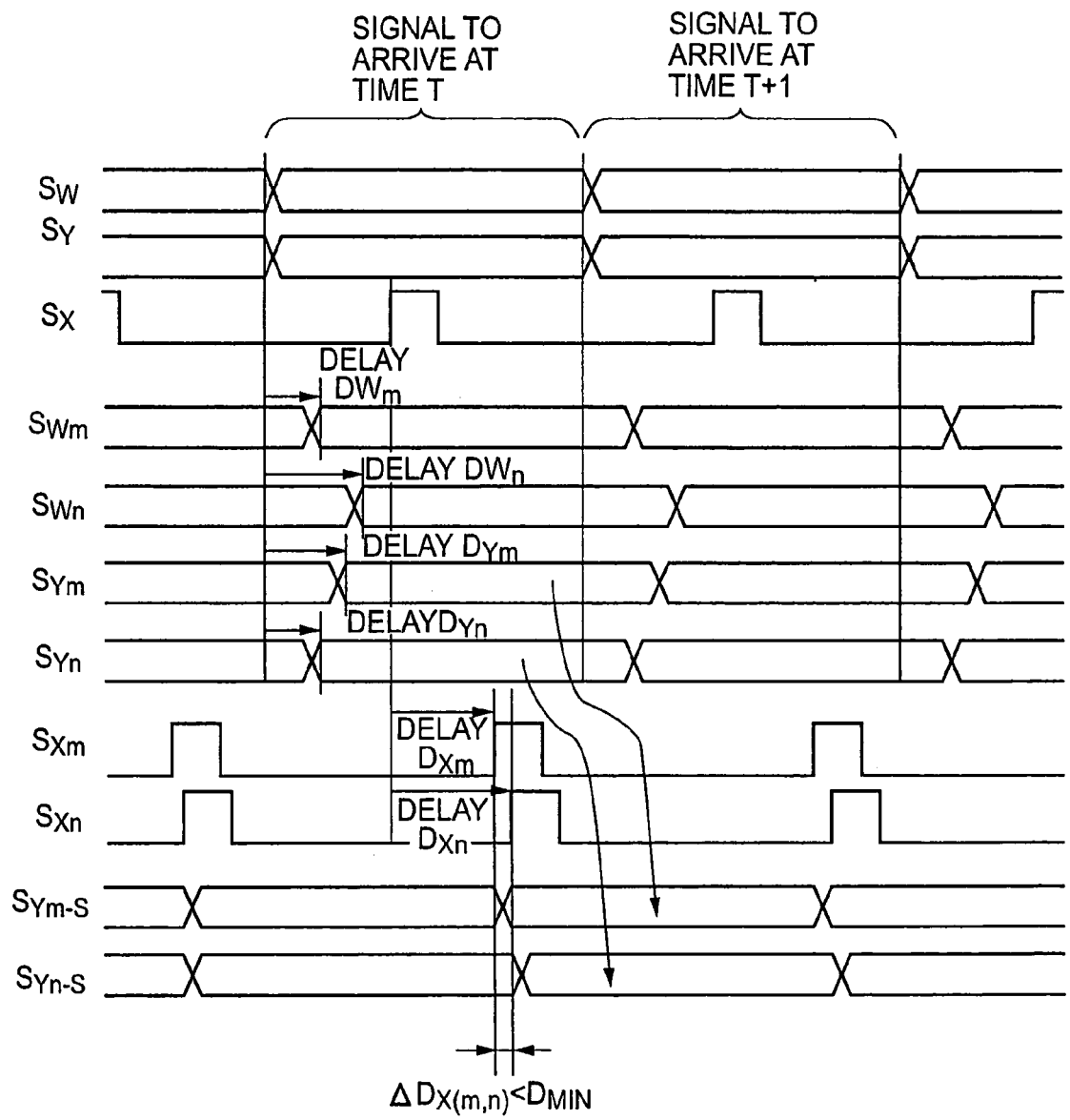
FIG. 7 is a timing chart explanatory of an example of operation of a shift correction circuit (synchronization circuit) in the second embodiment of the present invention.

FIG. 7 is a timing chart explanatory of an example of operation of the shift correction circuit (synchronization circuit) in the second embodiment. Assuming that signals $S_W$ and $S_Y$ which should arrive at time T are outputted from the signal generation devices W404 and Y403, in order to supply the signal $S_Y$ to the respective circuits at time T, the signal generation device X402 is activated so as to output a signal $S_X$ as a timing signal.

As described above, the signal $S_W$ outputted from the signal generation device W404 arrives at the circuits $C_m$ and $C_n$ of the programmable devices m and n as signals $S_{Wm}$ and $S_{Wn}$ with delays $D_{Wm}$ and $D_{Wn}$, respectively. It is not necessary to particularly adjust a difference between the delay $D_{Wm}$ and the delay $D_{Wn}$. Similarly, the signal $S_Y$ outputted from the signal generation device Y403 arrives at the pins $PY_m$ and $PY_n$ of the programmable devices m and n as signals $S_{Ym}$ and $S_{Yn}$ with delays $D_{Ym}$ and $D_{Yn}$, respectively. It is not necessary to particularly adjust a difference between the delay $D_{Ym}$ and the delay $D_{Yn}$.

Meanwhile, the signal $S_X$ outputted from the signal generation device X402 arrives at $PX_m$ and $PX_n$ of the programmable devices m and n as signals $S_{Xm}$ and $S_{Xn}$ with delays $D_{Xm}$ and $D_{Xn}$, respectively. As described above, a difference $\Delta D_{X(m,n)}$ between the delay $D_{Xm}$ and the delay $D_{Xn}$ is less than a minimum time $D_{MIN}$ required for data transfer between the programmable devices.

The shift correction circuit $DC_m$ synchronizes the signal $S_{Ym}$ with the signal $S_{Xm}$ and supplies a synchronization signal $S_{Ym-S}$ to the circuit $C_m$. Similarly, the shift correction circuit $DC_n$ synchronizes the signal $S_{Yn}$ with the signal $S_{Xn}$ and supplies a synchronization signal $S_{Yn-S}$ to the circuit $C_n$. Accordingly, the signal $S_Y$ which should arrive at the same time T can be supplied to the circuits $C_m$ and $C_n$ substantially at the same time without a substantial error ($\Delta D_{X(m,n)} < D_{MIN}$). Therefore, it is possible to avoid abnormal operation of the circuits which would be caused by skew of the signal $S_Y$ to be given at the same time, so that a circuit verification can be performed correctly.

Third Embodiment

Figure 8:
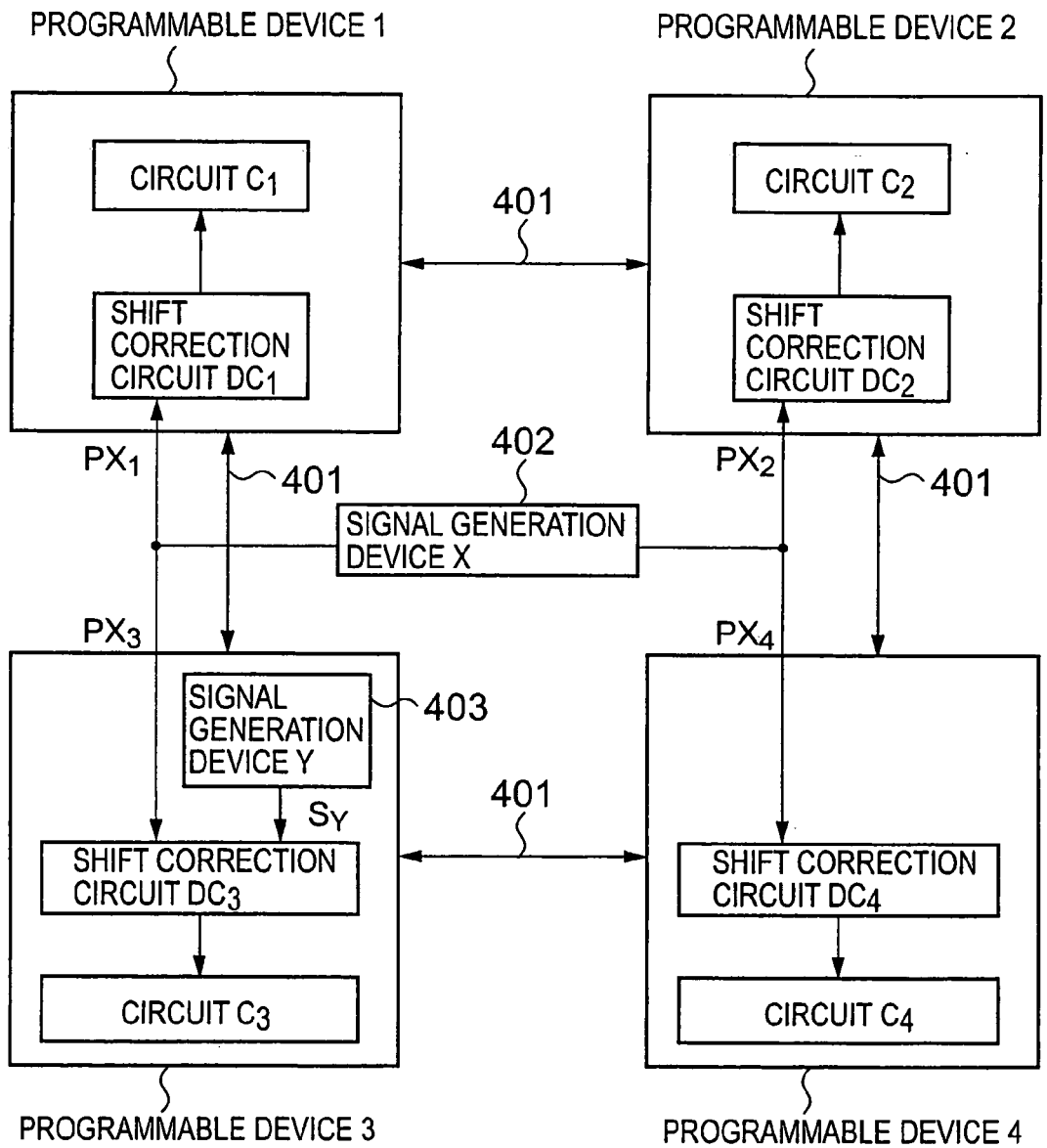
FIG. 8 is a schematic block diagram of a circuit verification apparatus according to a third embodiment of the present invention.

FIG. 8 is a schematic block diagram of a circuit verification apparatus according to a third embodiment of the present invention. FIG. 8 shows a case in which N=4. Specifically, divided circuits $C_1$, $C_2$, $C_3$, and $C_4$ and shift correction circuits $DC_1$, $DC_2$, $DC_3$, and $DC_4$ are allocated to four programmable devices 1, 2, 3, and 4, respectively.

In the third embodiment, a signal generation device Y403 operable to generate a signal $S_Y$ to be given at the same time is implemented in one programmable device 3. The signal $S_Y$ from the signal generation device Y403 is transferred to the other programmable devices through wiring 401, which connects between the programmable devices. Specifically, according to the third embodiment, when the division process part 203 (FIG. 4) in the circuit division apparatus 20 generates data for the programmable device 3, data incorporating the signal generation device Y403 are generated, and wiring is programmed so that the signal $S_Y$ is transferred to other programmable devices. Similarly, in other programmable devices, wiring is programmed so that the inputted signal $S_Y$ is transferred to other programmable devices.

In such an arrangement of the third embodiment, as with the second embodiment, a signal $S_{Xi}$ and a signal $S_{Yi}$ are inputted into the shift correction circuit $DC_i$ in each programmable device i. The value of the signal $S_{Yi}$ is synchronized with the signal $S_{Xi}$ and outputted to the circuit $C_i$. Thus, the signal $S_{Yi}$ becomes a signal in which a maximum skew of arrival time to the circuit $C_i$ is less than a minimum time required for data transfer between the programmable devices, i.e., a signal having a skew reduced to the same degree.

Additionally, since the signal generation device Y403 is incorporated in one programmable device so as to transfer a signal $S_Y$ to other programmable devices, the third embodiment has an advantage in that the number of parts can be reduced in the apparatus.

Fourth Embodiment

Figure 9:
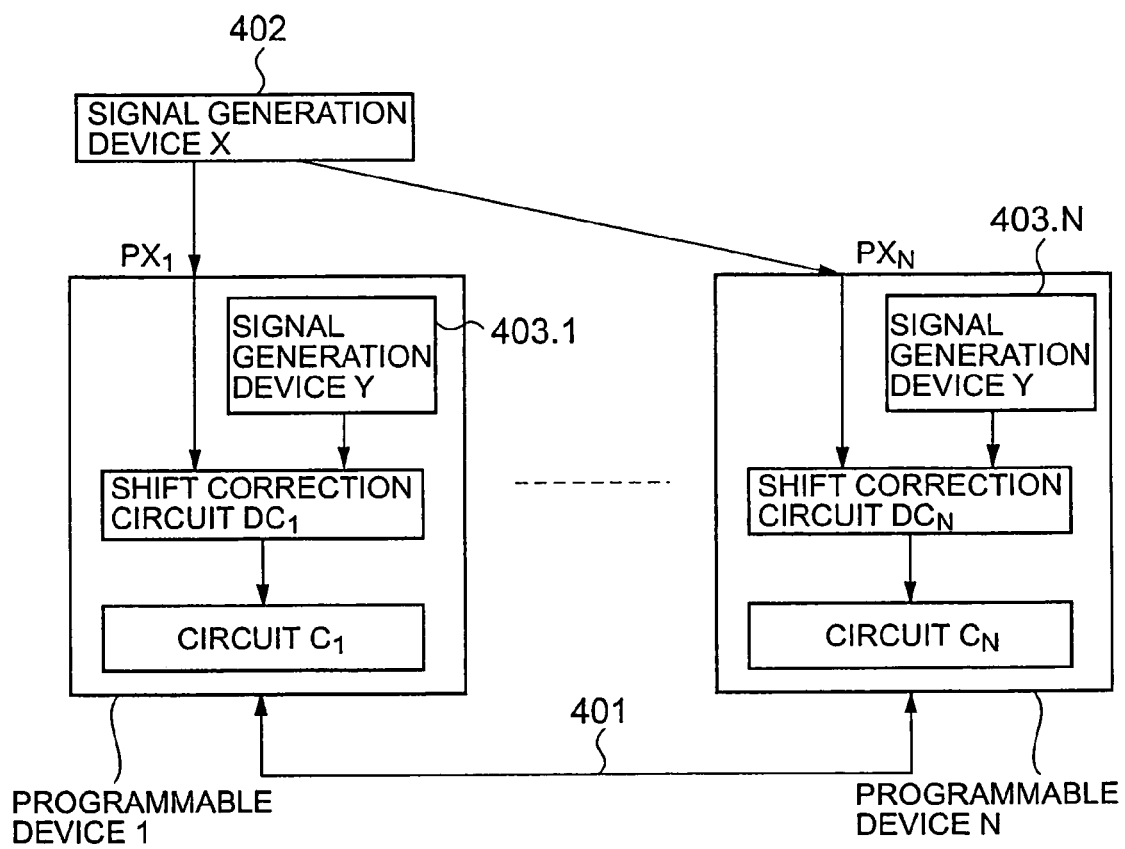
FIG. 9 is a schematic block diagram of a circuit verification apparatus according to a fourth embodiment of the present invention.

FIG. 9 is a schematic block diagram of a circuit verification apparatus according to a fourth embodiment of the present invention. In the fourth embodiment, signal generation devices Y403.1-Y403.N operable to generate a signal $S_Y$ to be given at the same time are implemented in programmable devices 1-N, respectively, in addition to circuits $C_1$-$C_N$ and shift correction circuits $DC_1$-$DC_N$. In order to form such a logical verification apparatus, when the division process part 203 (FIG. 4) in the circuit division apparatus 20 generates data for the respective programmable devices, a program of the signal generation device Y403 is copied, and data in which the signal generation device is incorporated in the respective programmable devices are generated.

In such an arrangement of the fourth embodiment, as with the second embodiment, a signal $S_{Xi}$ and a signal $S_{Yi}$ are inputted into the shift correction circuit $DC_i$ in each programmable device i. The value of the signal $S_{Yi}$ is synchronized with the signal $S_{Xi}$ and outputted to the circuit $C_i$. Thus, the signal $S_{Yi}$ becomes a signal in which a maximum skew of arrival time to the circuit $C_i$ is less than a minimum time required for data transfer between the programmable devices, i.e., a signal having a skew reduced to the same degree.

Additionally, since the signal generation devices Y403 are incorporated in the respective programmable devices, the fourth embodiment has an advantage in that the signal $S_Y$ is not required to be transferred to other programmable devices, that the number of parts can further be reduced in the apparatus, and that the arrangement can be simplified.

Fifth Embodiment

Figure 10A:
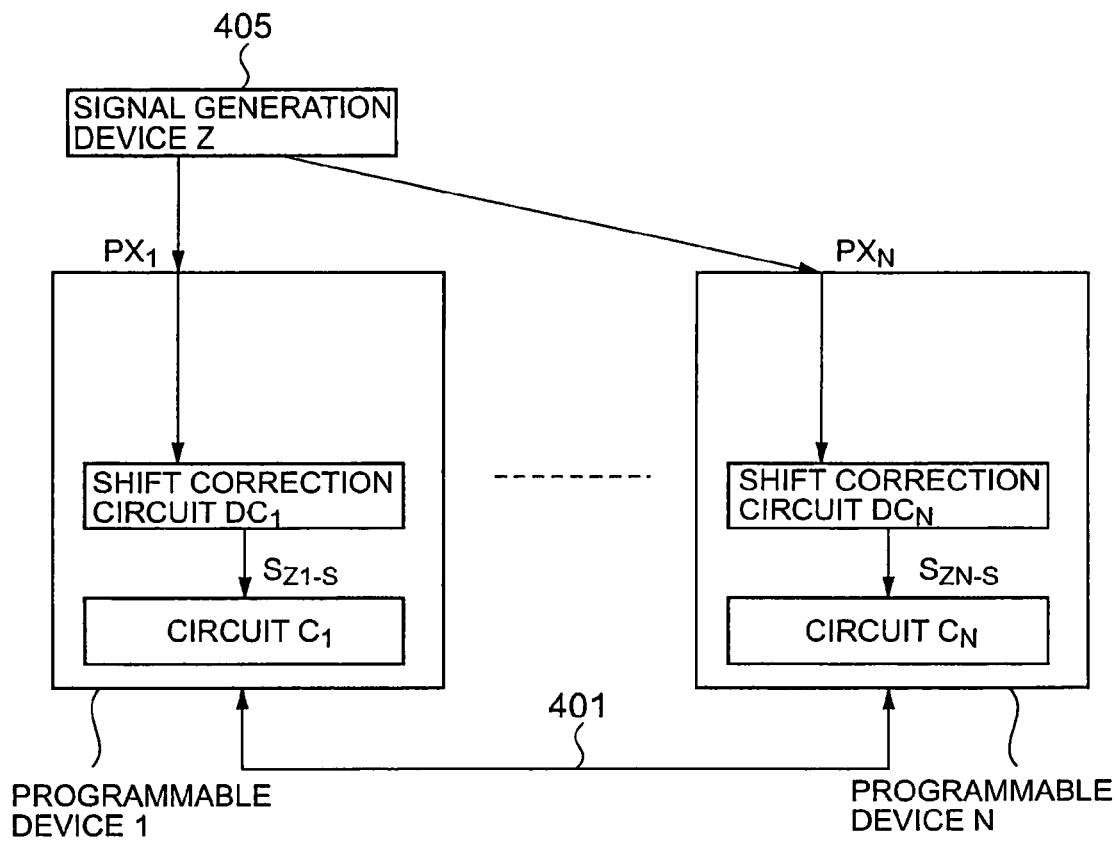
FIG. 10A is a schematic block diagram of a circuit verification apparatus according to a fifth embodiment of the present invention.
Figure 10B:
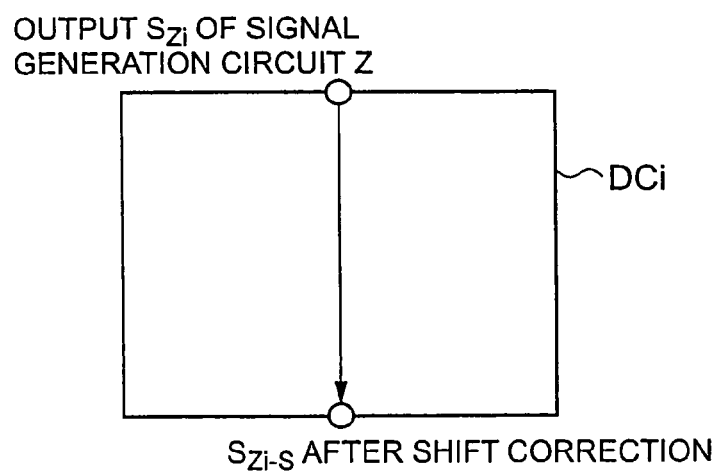
FIG. 10B is a diagram showing an arrangement of a shift correction circuit according to the fifth embodiment of the present invention.

FIG. 10A is a schematic block diagram of a circuit verification apparatus according to a fifth embodiment of the present invention, and FIG. 10B is a diagram showing an arrangement of a shift correction circuit according to the fifth embodiment of the present invention. The fifth embodiment is a variation of the first embodiment. Data for the corresponding programmable devices are written into programmable devices 1-N. Thus, pins $PX_1$-$PX_N$ for inputting a signal $S_Z$ to be given at the same time from a signal generation device Z405, circuits $C_1$-$C_N$, and shift correction circuits $DC_1$-$DC_N$ are formed.

As shown in FIG. 10B, an input terminal and an output terminal are directly connected to each other in each shift correction circuit $DC_i$, and no shift correction is performed. When a signal $S_Z$ is transferred from the signal generation device Z405 to the circuits $C_1$-$C_N$ in the programmable devices 1-N, arrival times $D_{Zi}$ (i=1, 2, ..., N) are different from each other because of differences of wiring path lengths. As in the case of the first embodiment, a maximum value of the arrival time difference (maximum skew) should be less than a minimum time $D_{MIN}$ required for data transfer through the wiring 401 between the programmable devices. With regard to delays caused in the programmable devices 1-N, variations can be reduced using speed constraint provided by an arrangement and wiring program for programmable devices.

When the respective programmable devices are thus programmed, the signal $S_Z$ to be given at the same time can be given directly to the respective pins $PX_1$-$PX_N$ of the programmable devices 1-N. Accordingly, it is possible to inhibit skews which would be caused if a signal were transmitted between programmable devices in the prior art.

EXAMPLE

Next, the present invention will be described in detail using an example in which the number of programmable devices is two (N=2) for brevity of the drawings.

Figure 11:
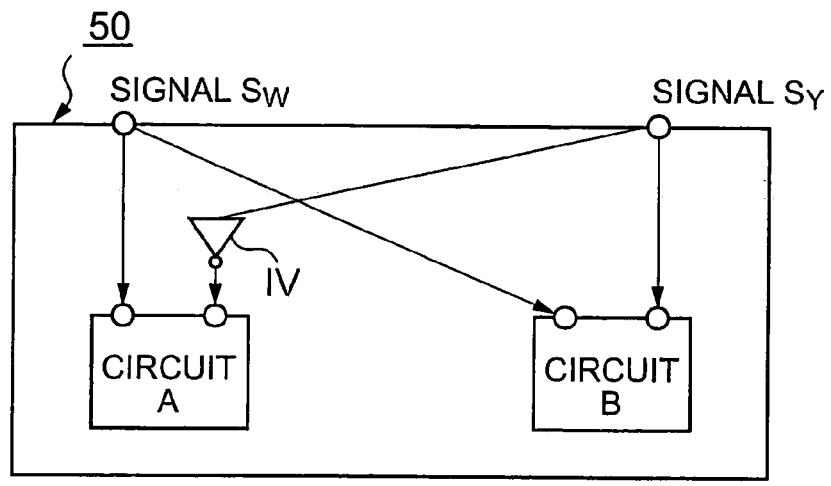
FIG. 11 is a circuit diagram showing an example of a circuit to be verified in an embodiment of the present invention.

FIG. 11 is a circuit diagram showing an example of a circuit to be verified. It is assumed that the circuit 50 to be verified includes circuits (storage elements) A and B, and that a signal $S_W$ is supplied directly to the circuits A and B. Meanwhile, a signal $S_Y$ is supplied via an inverter IV to the circuit A and is supplied directly to the circuit B. Further, as described above, it is assumed that the signal $S_Y$ is a clock signal of the storage element which should be given at the same time, and that the signal $S_W$ is a signal that is not required to be given at the same time.

When a data file 10 for such a circuit 50 to be verified is provided to the circuit division apparatus 20 as shown in FIG. 4, the division process part 203 displays signal names $S_X$ and $S_Y$ and all signal names included in the circuits A and B on the display part 204 as described above. When the signal $S_Y$ is specified as a signal to be given to the circuits A and B at the same time by a user, the division process part 203 performs a division process and generates data of circuits to be implemented in programmable devices 1 and 2 and shift correction circuits.

Figure 12:
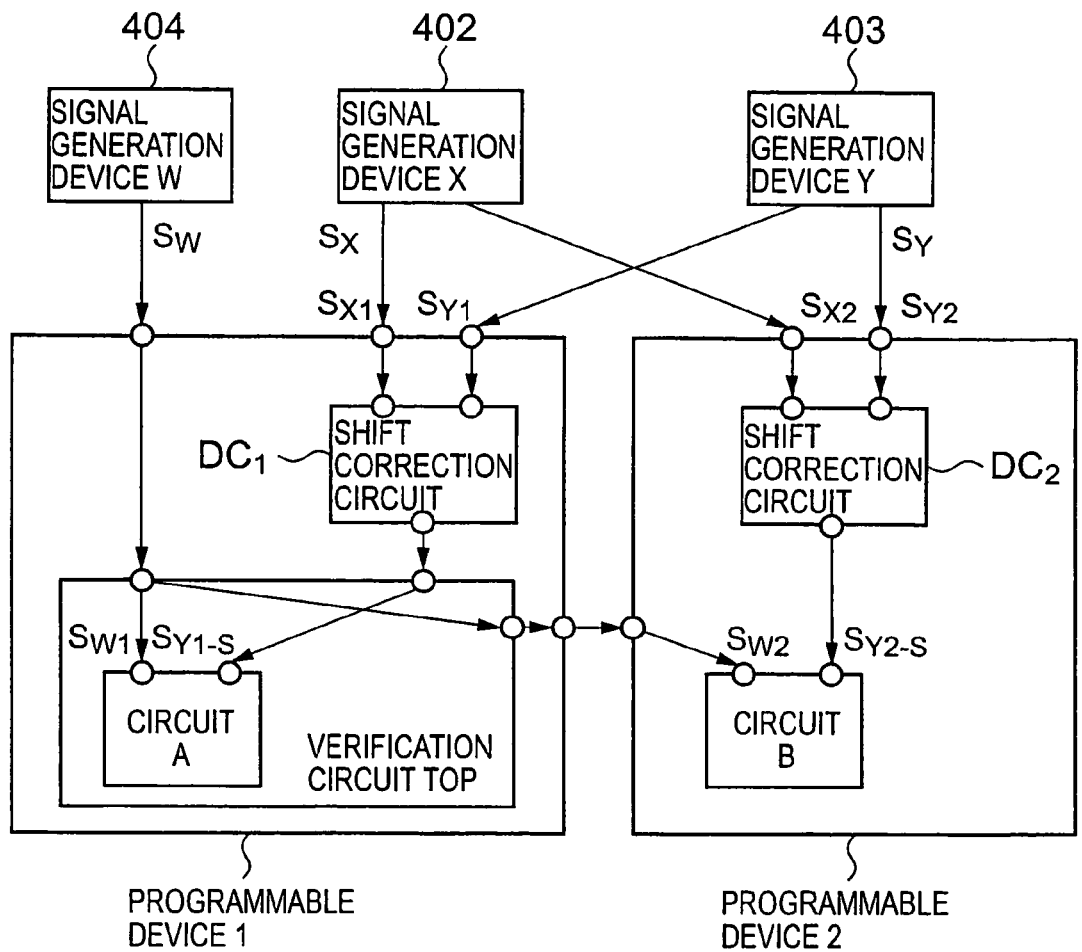
FIG. 12 is a block diagram of a circuit verification apparatus implemented in two programmable devices which are formed from the circuit to be verified shown in FIG. 11.

FIG. 12 is a block diagram of a circuit verification apparatus implemented in two programmable devices which are formed from the circuit 50 to be verified in FIG. 11. Since the signal $S_W$ is not a signal to be given at the same time, the value of the signal $S_W$ is transmitted to the circuit B of the programmable device 2 with use of wiring or the like which connects the programmable device 1 and the programmable device 2 to each other. The inverter IV connected between the signal $S_Y$ and the circuit A is removed. A circuit in which logic is inversed with respect to a clock signal of a storage element in the circuit A is formed. Such a configuration has no problems with regard to functions. Removal of the inverter eliminates an unnecessary delay.

FIG. 13 is a circuit diagram showing an example of the shift correction circuit implemented in each programmable device shown in FIG. 2. The shift correction circuit is formed by a flip-flop circuit having a data input of a signal $S_Y$ and a clock input of a signal $S_X$.

Figure 14:
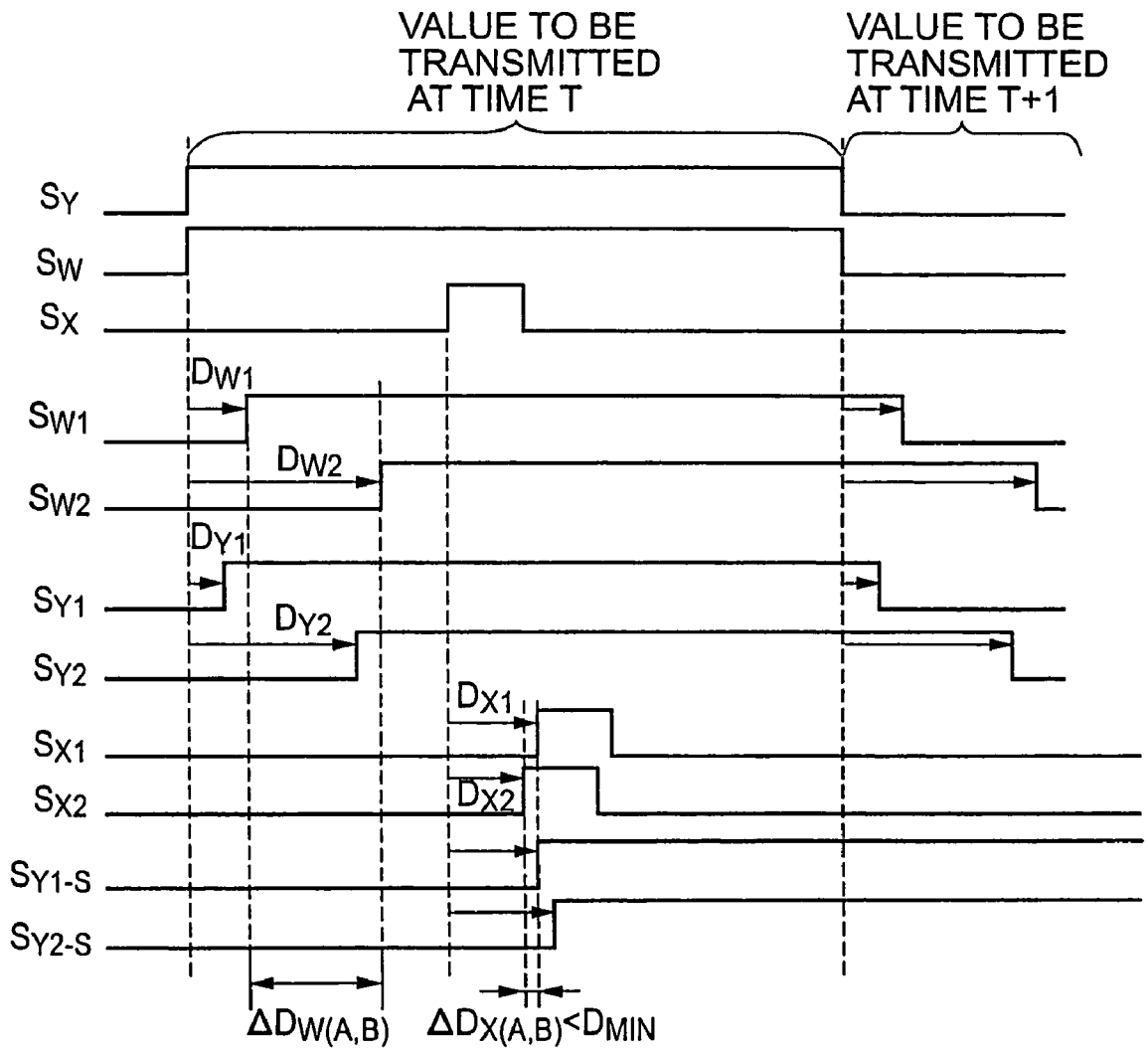
FIG. 14 is a timing chart explanatory of operation of the circuit verification apparatus shown in FIG. 12.

FIG. 14 is a timing chart explanatory of operation of the circuit verification apparatus shown in FIG. 12. Assuming that signals $S_W$ and $S_Y$ which should arrive at time T are outputted from the signal generation devices W404 and Y403, in order to supply the signal $S_Y$ to the respective circuits at time T, the signal generation device 402 is activated so as to output a signal $S_X$ as a timing signal.

The signal $S_W$ outputted from the signal generation device W403 arrives at the circuits A and B of the programmable devices 1 and 2 as signals $S_{W1}$ and $S_{W2}$ with delays $D_{W1}$ and $D_{W2}$, respectively. Similarly, the signal $S_Y$ outputted from the signal generation device Y403 arrives at the programmable devices 1 and 2 as signals $S_{Y1}$ and $S_{Y2}$ with delays $D_{Y1}$ and $D_{Y2}$, respectively.

Meanwhile, the signal $S_X$ outputted from the signal generation device X402 arrives at the programmable devices 1 and 2 as signals $S_{X1}$ and $S_{X2}$ with delays $D_{X1}$ and $D_{X2}$. As described above, a difference $\Delta D_{X(A,B)}$ between the delay $D_{X1}$ and the delay $D_{X2}$ is less than a minimum time $D_{MIN}$ required for data transfer between the programmable devices.

The shift correction circuit $DC_1$ synchronizes the signal $S_{Y1}$ with the signal $S_{X1}$ and supplies a synchronization signal $S_{Y1-S}$ to the circuit A. Similarly, the shift correction circuit $DC_2$ synchronizes the signal $S_{Y2}$ with the signal $S_{X2}$ and supplies a synchronization signal $S_{Y2-S}$ to the circuit B. Accordingly, the signal $S_Y$ which should arrive at the same time T can be supplied to the circuits A and B substantially at the same time without a substantial error ($\Delta D_{X(A,B)} < D_{MIN}$).

According to the present invention, an input terminal for inputting a signal (first signal) to be given at the same timing through a second wiring means is implemented in each of two or more simulation means. The first signal is inputted directly from a signal generation means through the input terminal. A maximum skew of time at which the first signal arrives at the two or more simulation means through the second wiring means is less than a minimum time required for data transfer through a first wiring means between the simulation means. Thus, it is possible to inhibit skews which would be caused if a signal were transmitted between simulation means in the prior art, It is possible to further improve the reliability of a circuit verification.

Each simulation means can use the first signal having a small skew as an input signal at the circuit part. Further, another second signal can be inputted, synchronized with the first signal having a small skew, and supplied to the circuit part. In this case, even if the second signal is inputted through wiring having a large skew, it is supplied in synchronism with the first signal. Accordingly, the second signal can be supplied at the same timing to the circuit parts of the respective simulation means. Specifically, the second signal can be distributed with use of wiring having lax skew conditions. It is possible to improve a degree of freedom in design of a circuit verification apparatus and the reliability of a circuit verification apparatus.

The invention claimed is:

1. A circuit division apparatus that produces program data for a plurality of programmable devices to simulate function operation of a circuit to be verified with the plurality of programmable devices, the circuit division apparatus being supplied with an input file in which contents of the circuit to be verified are described, the circuit division apparatus comprising a computer system including:

a circuit analysis part that is operable to analyze the input file to acquire circuit information;

a display part that displays, from signals which exist in the circuit to be verified, a first signal to be given at the same time to a plurality of storage elements included in the circuit to be verified;

an input part that inputs the first signal;

a division determination part that, when the circuit to be verified is divided into a plurality of partial circuits, determines programmable devices for simulating the plurality of partial circuits in accordance with the circuit information acquired with the circuit analysis part; and a division process part that produces program data for each of the programmable devices, the division process part dividing the circuit to be verified into the plurality of partial circuits in accordance with determination results of the division determination part and the circuit information acquired with the circuit analysis part, the division process part further setting connection destination for input terminals of the plurality of storage elements to which the first signal input by the input part is inputted to input terminals supplied with the first signal in the programmable devices simulating the functional operation of the plurality of storage devices, wherein the division process part, when producing the program data for each of the programmable devices having the input terminal supplied with the first signal, divides the circuit to be verified into the plurality of partial circuits in accordance with determination results of the division determination part and the circuit information acquired with the circuit analysis part, the division process part then implements shift correction circuits connected to the input terminals of the plurality of programmable devices to the plurality of programmable devices, and the division process part further sets the connection destination for the input terminals of the plurality of storage elements to which the first signal is supplied to output terminals of the shift correction circuits, which is implemented by the programmable devices simulating the functional operation of the plurality of storage elements.

2. A circuit verification apparatus including:

a plurality of programmable devices which operate in accordance with the program data produced by the circuit division apparatus according to claim 1;

a first wiring that connects between the plurality of programmable devices;

a first signal generating part that generates the first signal;

a second signal generating part that generates a second signal for synchronizing with the first signal;

a second wiring that connects between the first signal generating part and the input terminals supplied with the first signal in the plurality of programmable devices; and a third wiring that connects between the second signal generating part and the input terminals supplied with the second signal in the plurality of programmable devices, a maximum skew in the third wiring being less than a minimum delay time in the first wiring and each of the shift correction circuits being supplied with the first and the second signals and synchronizing the second signal with the first signal and outputting a synchronized signal.

3. A circuit verification apparatus including:
a plurality of programmable devices which operate in accordance with the program data produced by the circuit division apparatus according to claim 1;
a first wiring that connects between the plurality of programmable devices;
a first signal generating part that generates the first signal implemented in any of the plurality of programmable devices;
a second signal generating part that generates a second signal for synchronizing with the first signal; and
a second wiring that connects between the second signal generating part and the input terminals supplied with the first signal in the plurality of programmable devices,
a maximum skew in the second wiring being less than a minimum delay time in the first wiring, the first signal being supplied to the shift correction circuit implemented in each of the plurality of programmable devices through the first wiring, and each of the shift correction circuits being supplied with the first and the second signals and synchronizing the second signal with the first signal and outputting a synchronized signal.

4. A circuit verification apparatus which is used in combination with a circuit division apparatus that produces program data for a plurality of programmable devices to simulate function operation of a circuit to be verified with the plurality of programmable devices, the circuit division apparatus being supplied with an input file in which contents of the circuit to be verified are described, the circuit division apparatus comprising a computer system including:
a circuit analysis part that is operable to analyze the input file to acquire circuit information;
a display part that displays, from signals which exist in the circuit to be verified, a first signal to be given at the same time to a plurality of storage elements included in the circuit to be verified;
an input part that inputs the first signal;
a division determination part that, when the circuit to be verified is divided into a plurality of partial circuits, determines the programmable devices for simulating the plurality of partial circuits in accordance with the circuit information acquired with the circuit analysis part; and
a division process part that produces program data for each of the programmable devices,
the division process part dividing the circuit to be verified into the plurality of partial circuits in accordance with determination results of the division determination part and the circuit information acquired with the circuit analysis part,
the division process part further setting connection destination for input terminals of the plurality of storage elements to which the first signal input by the input part is inputted to input terminals supplied with the first signal in the programmable devices simulating the functional operation of the plurality of storage devices,
the circuit verification apparatus including:
the plurality of programmable devices which operate in accordance with the program data produced by the circuit division apparatus;
a first wiring that connects between the plurality of programmable devices;
a signal generating part that generates the first signal; and
a second wiring that connects between the signal generating part and the input terminals supplied with the first signal in the plurality of programmable devices,
a maximum skew in the second wiring being less than a minimum delay time in the first wiring.

5. A circuit division process method that produces program data for a plurality of programmable devices to simulate function operation of a circuit to be verified with the plurality of programmable devices, the method comprising:
supplying to a computer system an input file in which contents of the circuit to be verified are described;
dividing, by the computer system, the circuit to be verified into a plurality of partial circuits in accordance with information of a first signal, specified from signals which exist in the circuit to be verified, to be given at the same time to a plurality of storage elements included in the circuit to be verified and information of dividing results, when the circuit to be verified is divided into a plurality of partial circuits, the programmable devices for simulating the plurality of partial circuits with circuit information representing the circuit to be verified; and
setting, by the computer system, connection destination for input terminals of the plurality of storage elements to which the first signal is inputted to input terminals supplied with the first signal in the programmable devices simulating the functional operation of the plurality of storage devices, to thereby perform a division process that produces the program data for each of the programmable devices in which the input terminals are set,
wherein the division process comprises: when producing the program data for each of the programmable devices having the input terminal supplied with the first signal,
dividing the circuit to be verified in accordance with the information of the first signal and the dividing results;
implementing shift correction circuits connected to the input terminals of the plurality of programmable devices to the plurality of programmable devices; and
setting the connection destination for the input terminals of the plurality of storage elements to which the first signal is supplied to output terminals of the shift correction circuits which is implemented by the programmable devices simulating the functional operation of the plurality of storage elements.

* * * * *